(12) United States Patent
Corcelli

(10) Patent No.: US 7,652,517 B2
(45) Date of Patent: Jan. 26, 2010

(54) METHOD AND APPARATUS FOR GENERATING SYNCHRONOUS CLOCK SIGNALS FROM A COMMON CLOCK SIGNAL

(75) Inventor: Ciro Corcelli, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/735,219

(22) Filed: Apr. 13, 2007

(65) Prior Publication Data

US 2008/0252339 A1 Oct. 16, 2008

(51) Int. Cl.
*G06F 1/04* (2006.01)

(52) U.S. Cl. .................. 327/295; 327/291; 327/117

(58) Field of Classification Search .............. None
See application file for complete search history.

(56) References Cited

U.S. PATENT DOCUMENTS

| | | | | |
|---|---|---|---|---|
| 4,316,151 A | * | 2/1982 | Ooms | ............ 331/1 A |
| 4,516,251 A | | 5/1985 | Gallup | |
| 4,667,333 A | * | 5/1987 | Butcher | ............ 375/355 |
| 5,063,579 A | | 11/1991 | Sasaki et al. | |
| 5,260,705 A | * | 11/1993 | Inukai | ............ 341/155 |
| 5,438,601 A | | 8/1995 | Maegawa et al. | |
| 5,642,066 A | * | 6/1997 | Burke | ............ 327/132 |
| 6,031,425 A | | 2/2000 | Hasegawa | |
| 6,086,244 A | | 7/2000 | Yin | |
| 6,108,393 A | * | 8/2000 | Opsahl | ............ 377/47 |
| 6,466,065 B1 | | 10/2002 | Takekawa | |
| 6,759,886 B2 | * | 7/2004 | Nakanishi | ............ 327/295 |
| 6,779,125 B1 | | 8/2004 | Haban | |
| 6,968,029 B1 | | 11/2005 | Lee et al. | |
| 7,010,714 B1 | | 3/2006 | Tester | |
| 7,042,257 B2 | * | 5/2006 | Wang | ............ 327/115 |
| 7,109,762 B2 | * | 9/2006 | Neurauter et al. | ............ 327/115 |
| 2002/0003443 A1 | | 1/2002 | Hasegawa | |
| 2002/0163367 A1 | | 11/2002 | Murata | |
| 2003/0068003 A1 | | 4/2003 | Casagrande | |
| 2006/0193418 A1 | | 8/2006 | Fraasch et al. | |

\* cited by examiner

*Primary Examiner*—Cassandra Cox
(74) *Attorney, Agent, or Firm*—Schwegman, Lundberg & Woessner, P.A.

(57) ABSTRACT

A method and system for generating multiple clock signals from a reference clock signal are provided. In one implementation, the system includes a reference clock to generate a reference clock signal having a first frequency, a first prescaler to receive the reference clock signal and generate a first output clock signal having a pre-determined frequency relative to the first frequency of the reference clock signal, and a second prescaler to receive the first output clock signal and generate a second output clock signal having a second predetermined frequency relative to the first pre-determined frequency of the first output clock signal. The first output clock signal is substantially synchronous to the second output clock signal.

26 Claims, 7 Drawing Sheets

METHOD AND APPARATUS FOR GENERATING SYNCHRONOUS CLOCK SIGNALS FROM A COMMON CLOCK SIGNAL

FIELD OF THE INVENTION

The present invention relates generally to digital circuits, and more particularly to generating synchronous clock signals in a digital circuits.

BACKGROUND OF THE INVENTION

A synchronous digital circuit is a digital circuit in which parts (e.g., registers, logic gates, and so on) of the synchronous digital circuit are synchronized by a clock signal (referred to herein as a "clock"). For example, such parts of a synchronous digital circuit typically change state all at once when the clock changes state—e.g., during a rising edge of the clock. Conventional synchronous digital circuits typically include a reference clock from which multiple clocks having differing frequencies are generated. A common problem associated with generating multiple clocks (having differing frequencies) from a reference clock, however, is that the multiple clocks do not tend to be synchronous relative to one another, e.g., the rising edges of the multiple clocks are not generally aligned relative to one another.

BRIEF SUMMARY OF THE INVENTION

In general, in one aspect, this specification describes a system including a reference clock to generate a reference clock signal having a first frequency, a first prescaler to receive the reference clock signal and generate a first output clock signal having a pre-determined frequency relative to the first frequency of the reference clock signal, and a second prescaler to receive the first output clock signal and generate a second output clock signal having a second pre-determined frequency relative to the first pre-determined frequency of the first output clock signal. The first output clock signal is substantially synchronous to the second output clock signal.

Particular implementations can include one or more of the following features. The first prescaler can generate the first output clock signal having the predetermined frequency based on a divisor associated with the first prescaler. The divisor associated with the first prescaler can be run-time configurable by software. The system can further include a third prescaler to receive the second output clock signal and generate a third output clock signal having a third pre-determined frequency relative to the second pre-determined frequency of the second output clock signal. The third output clock signal can be substantially synchronous to each of the first output clock signal and the second output clock signal. The first output clock signal can have a period that is a power of 2 relative to a period of the reference clock signal. The second output clock signal can have a period that is a power of 2 relative to the period of the first output clock signal. The third output clock signal can have a period that is a power of 2 relative to the period of the second output clock signal. Each of the first output clock signal, the second output clock signal, and the third output clock signal can have rising edges that are substantially aligned relative to each other. Each of the first prescaler, the second prescaler, and the third prescaler can respectively comprise a plurality of ripple counters to generate the first output clock signal, the second output clock signal, and the third output clock signal. Each of the first prescaler, the second prescaler, and the third prescaler can respectively generate the first output clock signal, the second output clock signal, and the third output clock signal based on an undivided clock signal. The plurality of ripple counters of the first prescaler, the second prescaler, and the third prescaler can be configured to reconstruct the undivided clock signal for output to a next prescaler. The system can be implemented within a digital circuit. the digital circuit can form a part of a microcontroller, nonvolatile memory, logic, radio frequency (RF) component, or sensor.

In general, in another aspect, this specification describes a method for generating multiple clock signals from a reference clock signal. The method includes generating a reference clock signal having a first frequency, generating a first output clock signal using a first prescaler, and generating a second output clock signal using a second prescaler. The first output clock signal has a first pre-determined frequency relative to the first frequency of the reference clock signal, and the second output clock signal having a second pre-determined frequency relative to the first pre-determined frequency of the first output clock signal. The second output clock signal is substantially synchronous to the first output clock signal.

Particular implementations can include one or more of the following features. Generating the first output clock signal can include generating the first output clock signal to have the first predetermined frequency based on a divisor associated with the first prescaler. The method can further include configuring the divisor associated with the first prescaler during run-time to change the first pre-determined frequency of the first output clock signal. Configuring the divisor associated with the first prescaler can comprise configuring the divisor based on user input through software. The method can further include generating a third output clock signal using a third prescaler, in which the third output clock signal has a third pre-determined frequency relative to the second pre-determined frequency of the second output clock signal. The third output clock signal can be substantially synchronous to each of the first output clock signal and the second output clock signal.

Implementations may provide one or more of the following advantages. In one aspect, the techniques for generating multiple clocks from a common clock source (e.g., a reference clock) do not require use of a synchronizer to synchronize the multiple clocks. In addition, in one aspect, the techniques described herein do not require any special consideration during layout—i.e., the problems associated with synchronizing multiple clocks are solved at Register Transfer Level (RTL). RTL description is a way of describing the operation of a synchronous digital circuit. In RTL design, the behavior of a circuit is defined in terms of the flow of signals (or transfer of data) between hardware registers, and the logical operations performed on those signals. Register transfer level abstraction is commonly used in hardware description languages (HDLs) (e.g., Verilog and VHDL) to create high-level representations of a circuit, from which lower-level representations and ultimately actual wiring can be derived. Further, in one aspect, the techniques for generating a clock having a different frequency (and which is synchronous to other clocks) is modular and, therefore, a module (e.g., a prescaler) can be added without disrupting or modifying properties (e.g., timing) associated with other clocks.

The details of one or more implementations are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF THE INVENTION

The present invention relates generally to digital circuits, and more particularly to generating synchronous clock signals in a digital circuits. The following description is presented to enable one of ordinary skill in the art to make and use the invention and is provided in the context of a patent application and its requirements. The present invention is not intended to be limited to the implementations shown but is to be accorded the widest scope consistent with the principles and features described herein.

Figure 1:
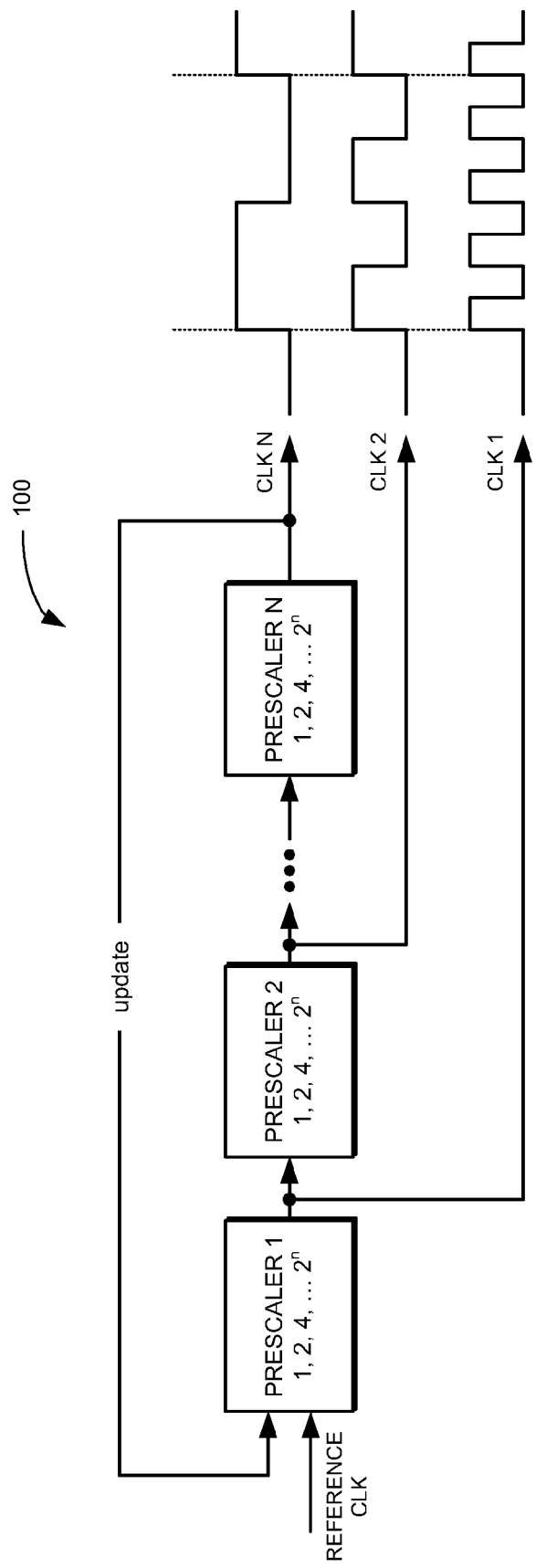
FIG. 1 is a block diagram of a system including a plurality of prescalers for respectively generating multiple clocks from a reference clock in accordance with one implementation.

FIG. 1 illustrates one implementation of a system 100 for generating multiple clocks from a common clock (e.g. a reference clock), in which the multiple clocks are synchronized to each other. The system 100 includes prescalers 1-N. In one implementation, each prescaler 1-N is a modular circuit that receives an input clock having a given frequency and generates an output clock having a frequency that is reduced relative to that of the input clock by a pre-determined factor. The system 100 guarantees that derived synchronous clocks (e.g., clocks 1-N) are always substantially in phase for every possible prescaler setting. Since clocks tapped out from different prescalers usually have different frequencies, those clocks (multi-frequency clocks) are defined to be in phase when the rising edge of a slower clock (e.g., clock 2) is aligned with the rising edge of a faster clock (e.g., clock 1).

In one implementation, each prescaler 1-N is run-time configurable by software. That is, (in one implementation) each prescaler 1-N is can be configured to generate an output clock having a period that is a power of 2 ($2^0, 2^1, \ldots, 2^n$) relative to the period of an input clock by changing a divisor factor associated with the prescaler. The time for a given clock to complete a cycle is the period, and frequency is the inverse of the period—i.e., the number of cycles in a second. As shown in FIG. 1, the prescaler 1 generates an output clock having a period that is power of 2 relative to the reference clock, and the prescaler 2 generates an output clock having a period that is power of 2 relative to the clock 1. In general, the $N^{th}$ generated output clock has a period that is a power of 2 relative to the $N^{th}-1$ generated clock. In one implementation, more than one prescaler can be configured at any given time, and clock frequency changes apply without loosing or stretching any period. In one implementation, when switching between prescaler settings, no glitches occur in the system 100. In such an implementation, no intermediate frequencies are generated, and the prescaler settings are updated in accordance with the rising edge of the slowest clock to avoid the generation of odd waveforms.

In one implementation, due to the modular design implementation of the system 100, a new stage (or prescaler) can be added (or an existing stage removed) from the system 100 by simply modifying few parameters in the implementation code. Also, in one implementation, the maximum division ratio of each stage is configurable by a parameter. Accordingly, implementations of the present invention eliminate the need to synchronize generated clocks, yet still have the capability to generate waveforms (or clocks) with the same physical property (e.g., a rising clock edge) regardless of a chosen division rate for a given stage. In addition, implementations of the present invention eliminate the need of a custom delay element in order to permit an undivided clock (clk_undiv) to propagate safely through each stage, thereby solving all timing problems at the Register Transfer Level (RTL) stage.

Figure 2:
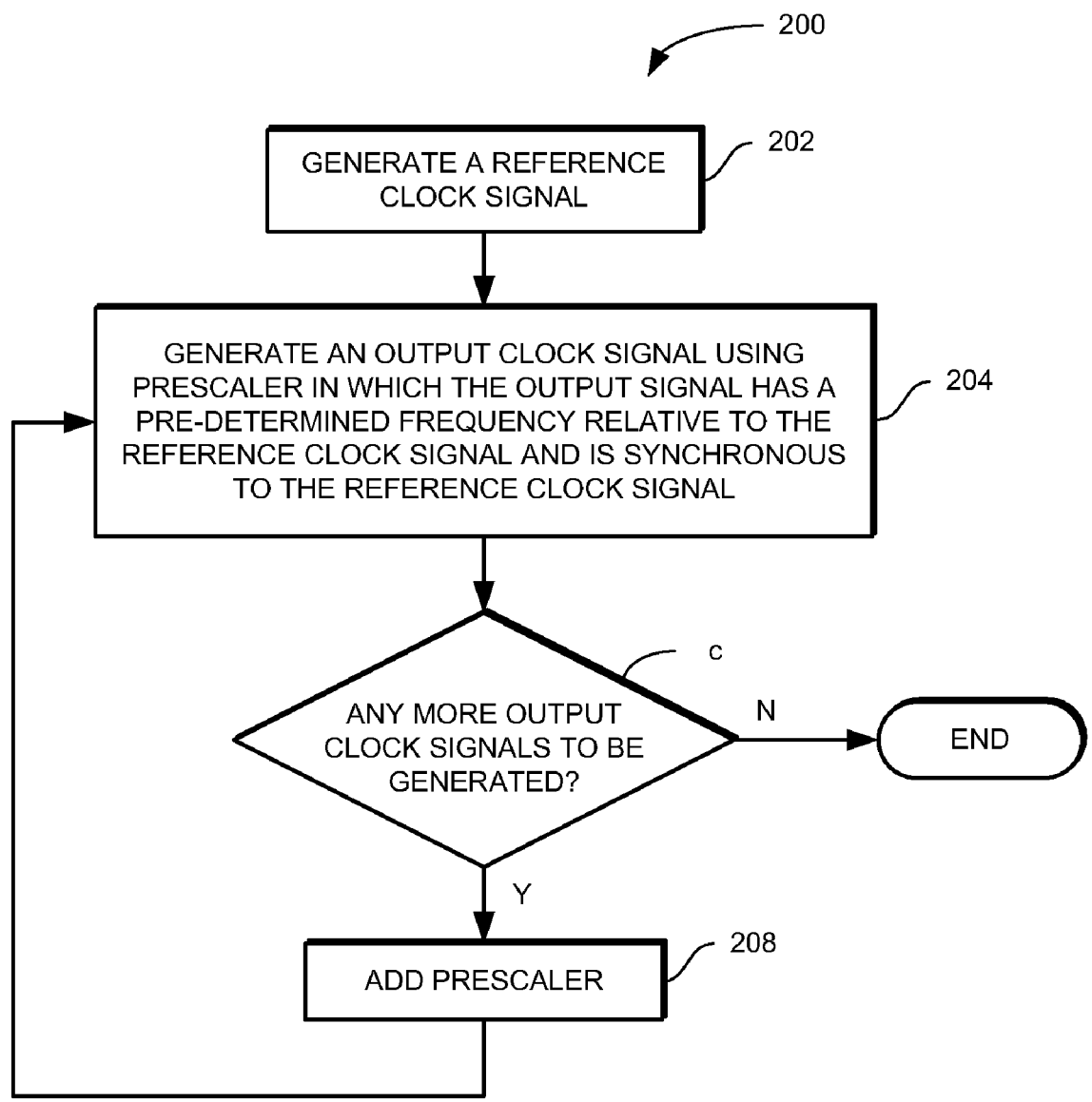
FIG. 2 is a method for generating multiple clocks from a reference clock in accordance with one implementation.

FIG. 2 illustrates a method 200 for generating multiple clocks (e.g., clocks 1-N of FIG. 1) in a system (e.g., system 100) from a reference clock in accordance with one implementation. A reference clock signal is generated (e.g., by a reference clock) (step 202). An output clock is generated (based on the reference clock signal) using a prescaler (e.g., prescaler 1) (step 204). The output clock signal has a predetermined frequency relative to the reference clock signal. In one implementation, the output clock has a period that is a power of 2 (e.g., $2^0, 2^1, \ldots, 2^n$) relative to the period of the reference clock, which period is based on a divisor factor associated with the prescaler. The divisor factor of the prescaler can be run-time configurable by software—e.g., configurable during normal operation of a circuit including the prescaler. A determination is made whether there are additional output clocks to be generated (step 206). In one implementation, such a determination is made during design time of the circuit at the RTL stage. If an additional output clock is to be generated, an additional prescaler is added to the system (step 208). The method 200 then returns to step 204, and generates an output clock that has a predetermined frequency relative to an output clock of a previous prescaler, and which is synchronous to the output clock associated with the previous prescaler. If in step 206, additional output clocks do not need to be generated, the method 200 ends.

Figure 3:
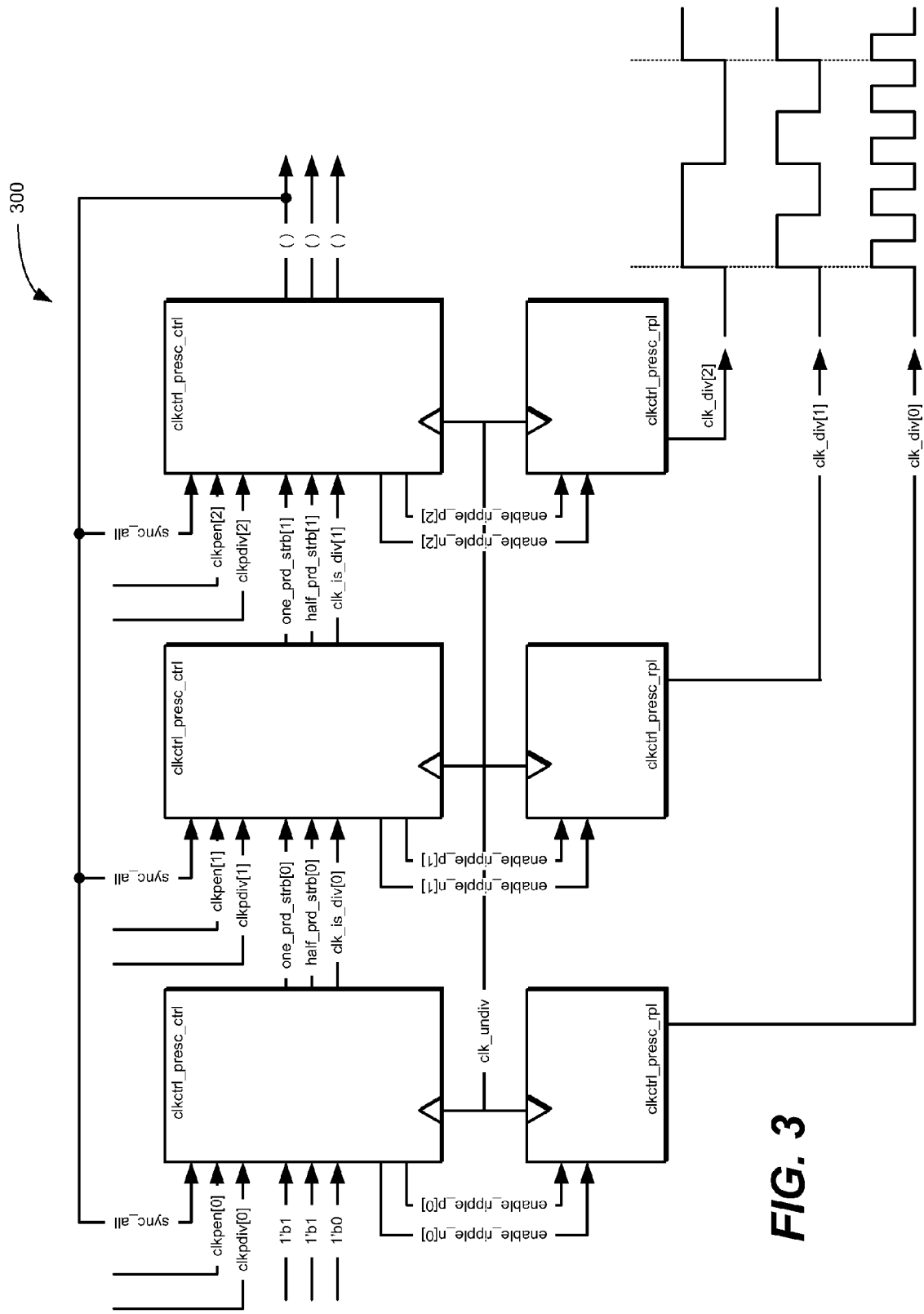
FIG. 3 is a block diagram of the prescalers of FIG. 1 in accordance with one implementation.
Figure 4:
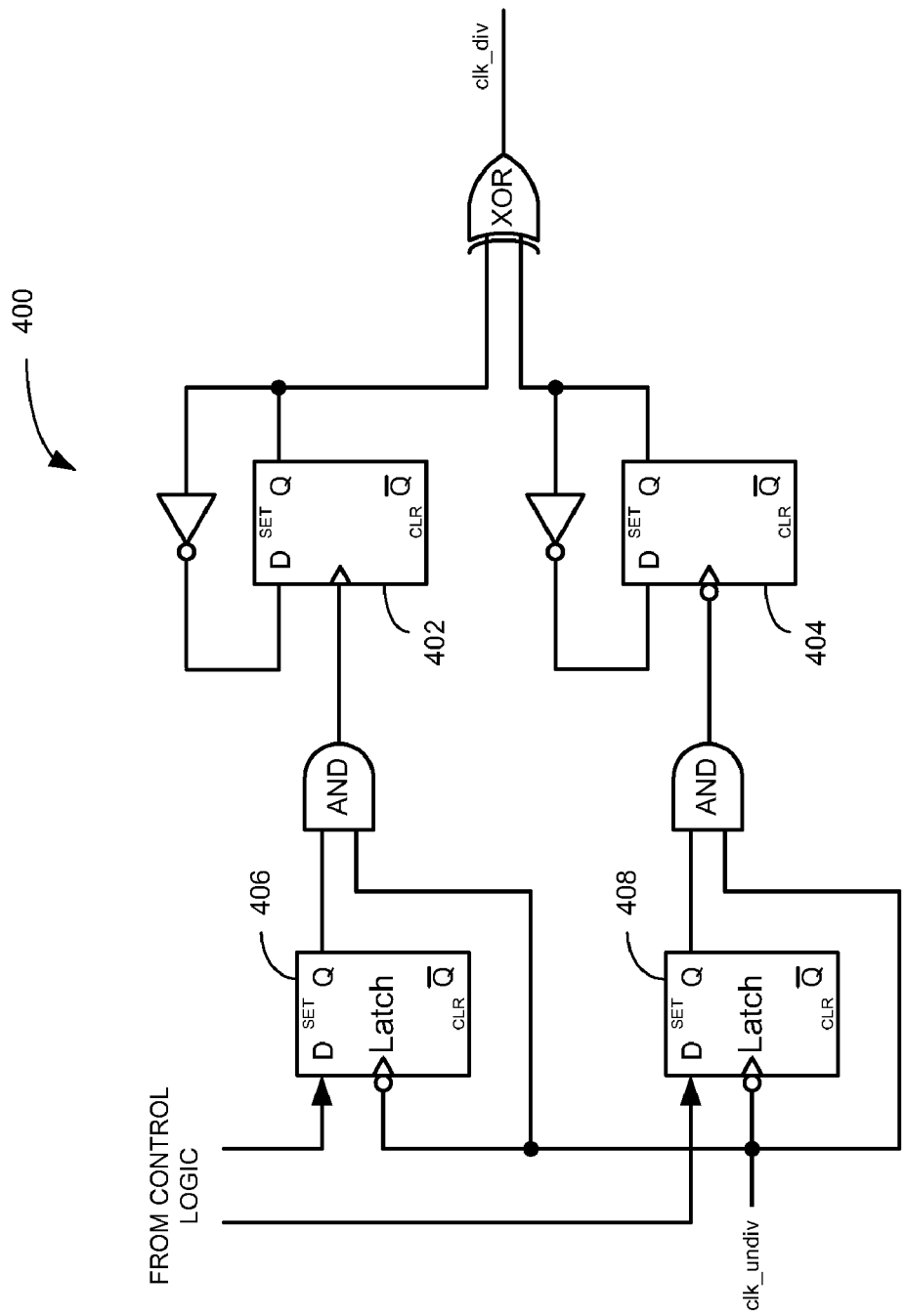
FIG. 4 is a schematic diagram of a module associated with the prescalers of FIG. 3 in accordance with one implementation.

Referring to FIG. 3, in one implementation, two modules—clkctrl_presc_rpl and clkctrl_presc_ctrl—constitute each prescaler 1-N of FIG. 1. FIG. 4 illustrates one implementation of a clkctrl_presc_rpl module 400. The clkctrl_presc_rpl module 400 includes a pair of ripple counters 402, 404 that are each clocked on opposite edges of the undivided clock reference (clk_undiv). The clock of each ripple counter 402, 404 is respectively controlled by a clock-gating element 406, 408 whose enable signal is a control signal from the clkctrl_presc_ctrl module. By operating on these control signals, the ripple counters 402, 404 are operable to generate an output clock having a range of possible frequencies. The clkctrl_presc_ctrl module generates the control signals for the clkctrl_presc_rpl module that opportunely enable and disable the ripple counters 402, 404. In one implementation, using the ripple counters 402, 404 to generate output clock signals (or waveforms) ensures that the output clocks always have the same electrical properties no matter which frequency is selected. In one implementation, the transition time for the rising or falling edge (of a given output clock signal) will always be the same since the fan-out of each ripple counter 402, 404 is an inverter and an XOR gate. In one implementation, particular attention must be taken in implementing the XOR gate. That is, in such an implementation, the XOR gate must be as symmetric as possible to ensure a same transition time for the rising and falling edges and to reduce jitter when the prescaler is operating in a "divide by 1" mode. The XOR gate can be made symmetric through proper sizing of the P and N transistors of the XOR gate.

Figure 5:
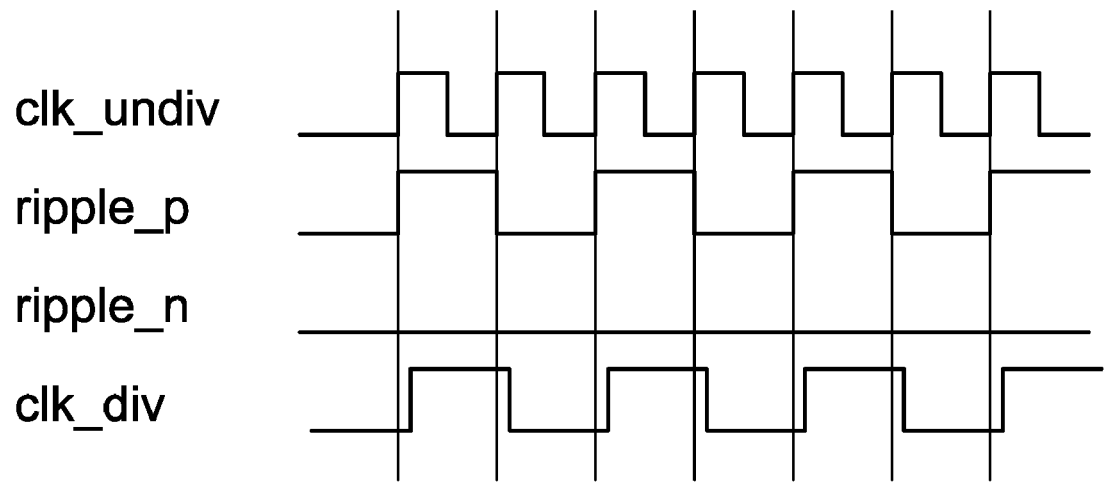
FIG. 5 is an example timing diagram of a "divide by N" waveforms associated with a positive-triggered and a negative-triggered ripple counter.
Figure 6:
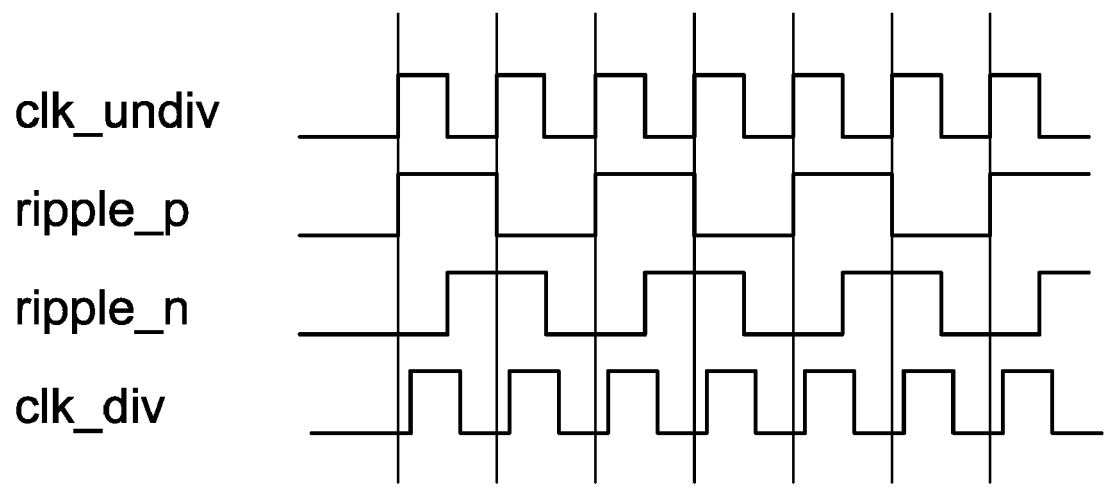
FIG. 6 is an example timing diagram of a "divide by 1" waveforms associated with a positive-triggered and a negative-triggered ripple counter.

FIGS. 5 and 6 respectively illustrate timing diagrams associated with a "divide by N" waveform and a "divide by 1" waveform. Referring first to FIG. 5, (in one implementation) a "divided by N" waveform is generated when the current prescaler is enabled (division>1) and/or at least one of the previous prescalers in series is enabled. In this case, the negative-triggered ripple counter (ripple_n) is disabled and, therefore, the output of the negative-triggered ripple counter (ripple_n) is a constant value. Thus, the output waveform is determined only by the positive-triggered ripple counter (ripple_p), which is attained through XOR of a clock with a constant, as shown in FIG. 5. Referring to FIG. 6, the "divide by 1" waveform is generated when the current prescaler and all of the previous prescalers in series are disabled. In one implementation, to create a "divide by 1" waveform, the negative-triggered ripple counter (ripple_n) is enabled and generates the same waveform as that of the positive-triggered ripple counter (ripple_p) but shifted 90 degrees in phase. By XOR-ing these two waveforms, the original undivided clock (clock_undiv) can be reconstructed. There is no risk in reconstructing the original undivided clock (clock_undiv) in such a manner as the two waveforms have a 90 degree difference in phase—i.e., when one clock changes level, the other clock is stable.

Figure 7:
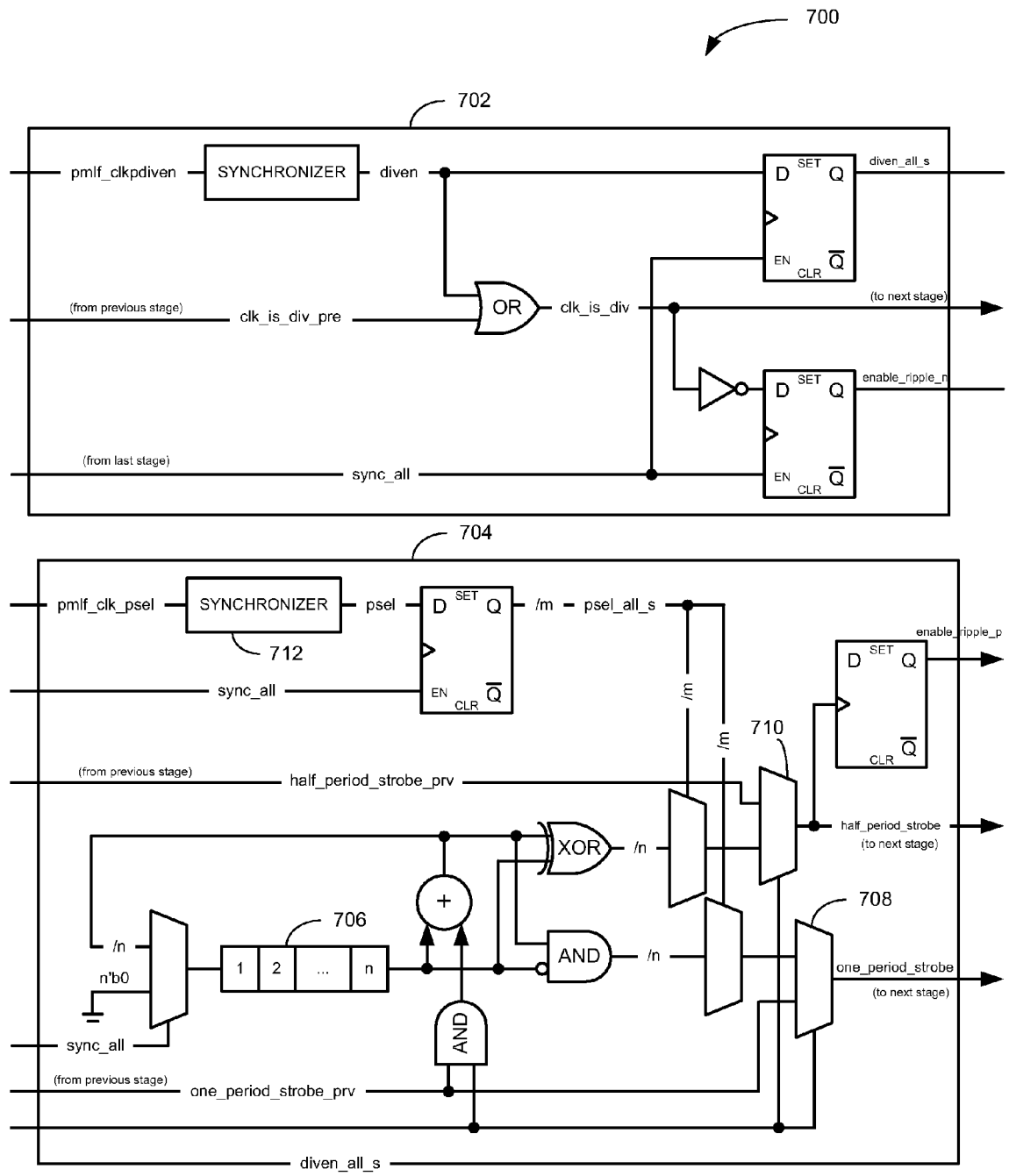
FIG. 7 is a schematic diagram of a module associated with the prescalers of FIG. 3 in accordance with one implementation.

FIG. 7 illustrates one implementation of a clkctrl_presc_ctrl module 700. In one implementation, the clkctrl_presc_ctrl module 700 includes control logic 702 and control logic 704. The control logic 702 generates the enable signal for the negative-triggered ripple counter, and (in one implementation) the control logic 702 only checks that none of the current and previous prescaler in series are enabled. In one implementation, any changes are updated only when all the waveforms are synchronized. In one implementation, the control logic 704 (to generate the enable signal for the positive-triggered ripple counter) is based on use of a synchronous counter 706. The synchronous counter 706 is incremented each time the synchronous counter 706 receives a carry-in from a previous prescaler stage (the carry indicates that a clock from the previous stage has terminated one period). The carry-in for the first prescaler stage is tied to logic one. A negative-edge detector 708 is connected to each bit of the synchronous counter 706 to indicate when a "divide by N" waveform has terminated one period. An edge detector 710 is connected to each bit of the synchronous counter 706 to indicate when a "divide by N" waveform has terminated a half period.

In one implementation, the enable signal for the positive-triggered ripple counter is selected in the following manner. If the current stage is enabled, the strobe from the edge detector (delayed one cycle) is used. If the current stage is disabled, the strobe from the edge detector of the previous stage (delayed one cycle) is used. In one implementation, the carry to the next prescaler stage is selected in the following manner. If the current stage is enabled, the strobe from the negative-edge detector is used. If the current stage is disabled, the strobe from the negative-edge detector of the previous stage is used.

User registers (not shown) for configuring (a divisor of) a prescaler may be asynchronous to the original undivided clock (clock_undiv). In such a case, a handshake synchronizer 712 is implemented within the control logic 704. In one implementation, if a given prescaler is busy performing a clock division change, any attempt to write to the user registers are discarded by hardware. In one implementation, once the user registers are written, a change will take place only when all the waveforms are in phase. In one implementation, any attempt to write a division ratio larger than that which is permitted will be discarded and automatically replaced with a maximum allowed division ratio, and the user registers will be updated accordingly.

Figure 8:
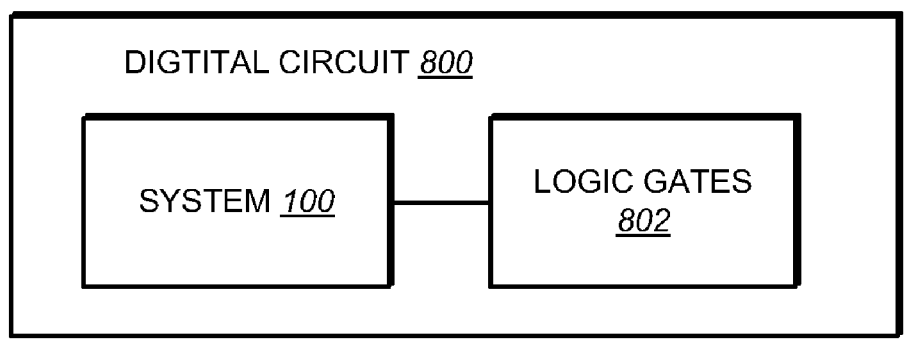
FIG. 8 is a block diagram of a digital circuit including a system of prescalers in accordance with one implementation.

FIG. 8 illustrates a digital circuit 800 including the system 100 coupled to logic gates 802. In general, the digital circuit 800 can be a part of any digital circuit including, for example, microcontrollers, nonvolatile memory, logic, radio frequency (RF) components, sensors, and so on.

Various implementations for generating multiple clocks from a reference clock have been described. Nevertheless, various modifications may be made to the implementations. For example, steps of the method discussed above can be performed in a different order and still achieve desirable results. Accordingly, many modifications may be made without departing from the scope of the following claims.

What is claimed is:

1. A system comprising:
   a reference clock generator to generate a reference clock signal having a first frequency;
   a first prescaler to receive the reference clock signal and having ripple counters to generate a first output clock signal having a second frequency relative to the first frequency; and
   a second prescaler to receive the first output clock signal and generate a second output clock signal having a third frequency relative to the second frequency, wherein the first output clock signal is substantially synchronous to the second output clock signal.

2. The system of claim 1, wherein the second frequency has a value based on a divisor associated with the first prescaler.

3. The system of claim 1, further comprising a third prescaler to receive the second output clock signal and generate a third output clock signal having a fourth frequency relative to the third frequency, wherein the third output clock signal is substantially synchronous to each of the first output clock signal and the second output clock signal.

4. The system of claim 3, wherein:
   the first output clock signal has a period that is a power of two relative to a period of the reference clock signal;
   the second output clock signal has a period that is a power of two relative to the period of the first output clock signal; and
   the third output clock signal has a period that is a power of two relative to the period of the second output clock signal.

5. The system of claim 3, wherein each of the first output clock signal, the second output clock signal, and the third output clock signal has rising edges that are substantially aligned relative to each other.

6. A digital circuit comprising the system of claim 3.

7. The digital circuit of claim 6, wherein the digital circuit forms a part of a microcontroller, nonvolatile memory, logic, radio frequency (RF) component, or sensor.

8. A system comprising:
a reference clock generator to generate a reference clock signal having a first frequency;
a first prescaler to receive the reference clock signal and generate a first output clock signal having a second frequency based on a divisor associated with the first prescaler and relative to the first frequency, wherein the divisor associated with the first prescaler is run-time configurable by software; and
a second prescaler to receive the first output clock signal and generate a second output clock signal having a third frequency relative to the second frequency, wherein the first output clock signal is substantially synchronous to the second output clock signal.

9. A system comprising:
a reference clock generator to generate a reference clock signal having a first frequency;
a first prescaler to receive the reference clock signal and generate a first output clock signal having a second frequency relative to the first frequency;
a second prescaler to receive the first output clock signal and generate a second output clock signal having a third frequency relative to the second frequency, wherein the first output clock signal is substantially synchronous to the second output clock signal; and
a third prescaler to receive the second output clock signal and generate a third output clock signal having a fourth frequency relative to the third frequency, wherein the third output clock signal is substantially synchronous to each of the first output clock signal and the second output clock signal, and wherein each of the first prescaler, the second prescaler, and the third prescaler comprises a plurality of ripple counters to respectively generate the first output clock signal, the second output clock signal, and the third output clock signal.

10. The system of claim 9, wherein:
each of the first prescaler, the second prescaler, and the third prescaler is configured to respectively generate the first output clock signal, the second output clock signal, and the third output clock signal based on an undivided clock signal; and
wherein the plurality of ripple counters of the first prescaler, the second prescaler, and the third prescaler are configured to reconstruct the undivided clock signal for output to a next prescaler.

11. A method for generating multiple clock signals from a reference clock signal, the method comprising:
generating a reference clock signal having a first frequency;
generating a first output clock signal using a first prescaler that includes ripple counters, the first output clock signal having a second frequency relative to the first frequency; and
generating a second output clock signal using a second prescaler, the second output clock signal having a third frequency relative to the second frequency, wherein the second output clock signal is substantially synchronous to the first output clock signal.

12. The method of claim 11, wherein second frequency has a value based on a divisor associated with the first prescaler.

13. The method of claim 11, further comprising generating a third output clock signal using a third prescaler, the third output clock signal having a fourth frequency relative to the third frequency of the second output clock signal, wherein the third output clock signal is substantially synchronous to each of the first output clock signal and the second output clock signal.

14. The method of claim 13, wherein:
the first output clock signal has a period that is a power of two relative to a period of the reference clock signal;
the second output clock signal has a period that is a power of two relative to the period of the first output clock signal; and
the third output clock signal has a period that is a power of two relative to the period of the second output clock signal.

15. The method of claim 13, wherein each of the first output clock signal, the second output clock signal, and the third output clock signal has rising edges that are substantially aligned relative to each other.

16. A method for generating multiple clock signals from a reference clock signal, the method comprising:
generating a reference clock signal having a first frequency;
generating a first output clock signal using a first prescaler, the first output clock signal having a second frequency relative to the first frequency and having a value based on a divisor associated with the first prescaler;
generating a second output clock signal using a second prescaler, the second output clock signal having a third frequency relative to the second frequency, wherein the second output clock signal is substantially synchronous to the first output clock signal; and
configuring the divisor associated with the first prescaler during run-time to change the second frequency of the first output clock signal.

17. The method of claim 16, wherein configuring the divisor associated with the first prescaler comprises configuring the divisor based on user input through software.

18. An apparatus comprising:
a first circuit responsive to an input clock signal to generate a first output clock signal having a first frequency relative to a frequency of the input clock signal; and
a second circuit to receive the first output clock signal and, responsive to the input clock signal and to the first output clock signal, to generate a second output clock signal having a second frequency relative to the first frequency, wherein the first and second output clock signals have edges that are substantially aligned with each other.

19. The apparatus of claim 18, wherein the second output clock signal has a period that is a power of two relative to a period of the first output clock signal.

20. The apparatus of claim 19, wherein the first output clock signal has a period that is a power of two relative to a period of the input clock signal.

21. The apparatus of claim 18 further comprising a third circuit to receive the second output clock signal, and responsive to the input clock signal and the second output clock signal, to generate a third output clock signal having a third frequency relative to the second frequency.

22. An apparatus comprising:
a first circuit responsive to an input clock signal to generate a first output clock signal having a first frequency relative to a frequency of the input clock signal, wherein the first circuit includes flip-flops to generate the first output clock signal; and
a second circuit to receive the first output clock signal and, responsive to the input clock signal and to the first output clock signal, to generate a second output clock signal having a second frequency relative to the first frequency.

23. The apparatus of claim 22, wherein the flip-flops are configured to be clocked on opposite edges of the input clock signal.

24. The apparatus of claim 22, wherein the first circuit further includes a logic unit including logic unit input nodes to receive output signals from the flip-flops and a logic unit output node to provide the first output clock signal.

25. The apparatus of claim 22, wherein one of the flip-flops is disabled when the first circuit generates the first output clock signal with the first frequency equal to the frequency of the input clock signal.

26. The apparatus of claim 22, wherein the second circuit includes additional flip-flops to generate the second output clock signal.

* * * * *